(12) United States Patent
Yen et al.

(10) Patent No.: US 9,746,777 B2
(45) Date of Patent: Aug. 29, 2017

(54) EXPOSURE APPARATUS AND EXPOSURE METHOD THEREOF

(71) Applicant: Taiwan Semiconductor Manufacturing CO., LTD., Hsinchu (TW)

(72) Inventors: Wen-Yen Yen, Zhubei (TW); Yen-Chen Liao, Taipei (TW); Chien-Li Chen, Zhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 158 days.

(21) Appl. No.: 14/150,951

(22) Filed: Jan. 9, 2014

(65) Prior Publication Data

US 2015/0192857 A1    Jul. 9, 2015

(51) Int. Cl.
*G03B 27/42* (2006.01)
*G03F 7/20* (2006.01)

(52) U.S. Cl.
CPC .................. *G03F 7/7015* (2013.01)

(58) Field of Classification Search
CPC .... G03F 7/70275; G03F 7/20; G03F 7/70258; G03F 7/70391; G03F 7/70575; G03F 7/70833; G03F 7/70141; G03F 7/70991; G02B 27/0905
See application file for complete search history.

(56) References Cited

U.S. PATENT DOCUMENTS

| | | | | |
|---|---|---|---|---|
| 2003/0002024 | A1* | 1/2003 | Motegi | G03F 7/70058 355/69 |
| 2005/0213070 | A1* | 9/2005 | Scharnweber | G03F 7/70208 355/69 |
| 2006/0012766 | A1* | 1/2006 | Klosner et al. | 355/67 |
| 2009/0262324 | A1* | 10/2009 | Patra | G03F 7/7085 355/68 |
| 2010/0220303 | A1* | 9/2010 | Fiolka | 355/53 |

* cited by examiner

*Primary Examiner* — Mesfin Asfaw

(57) ABSTRACT

An exposure apparatus includes at least one radiation source, a plurality of projection lenses, and a lens switch. The radiation source is operable for providing a radiation beam. The lens switch is operable for selecting one of the projection lenses to focus the radiation beam to a target plane.

20 Claims, 2 Drawing Sheets

EXPOSURE APPARATUS AND EXPOSURE METHOD THEREOF

BACKGROUND

Photolithography is a process to pattern parts of a thin film or the bulk of a substrate. Photolithography uses light to transfer a pattern from a photomask, i.e. a reticle, to a light-sensitive layer, i.e. a photoresist, on the substrate. The light-sensitive layer is exposed to a pattern of light by transmitting light through the photomask onto the light-sensitive layer. The exposure to light causes a change that allows parts of the light-sensitive layer to be removed by a developer, and thus the pattern from the photomask is transferred to the light-sensitive layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
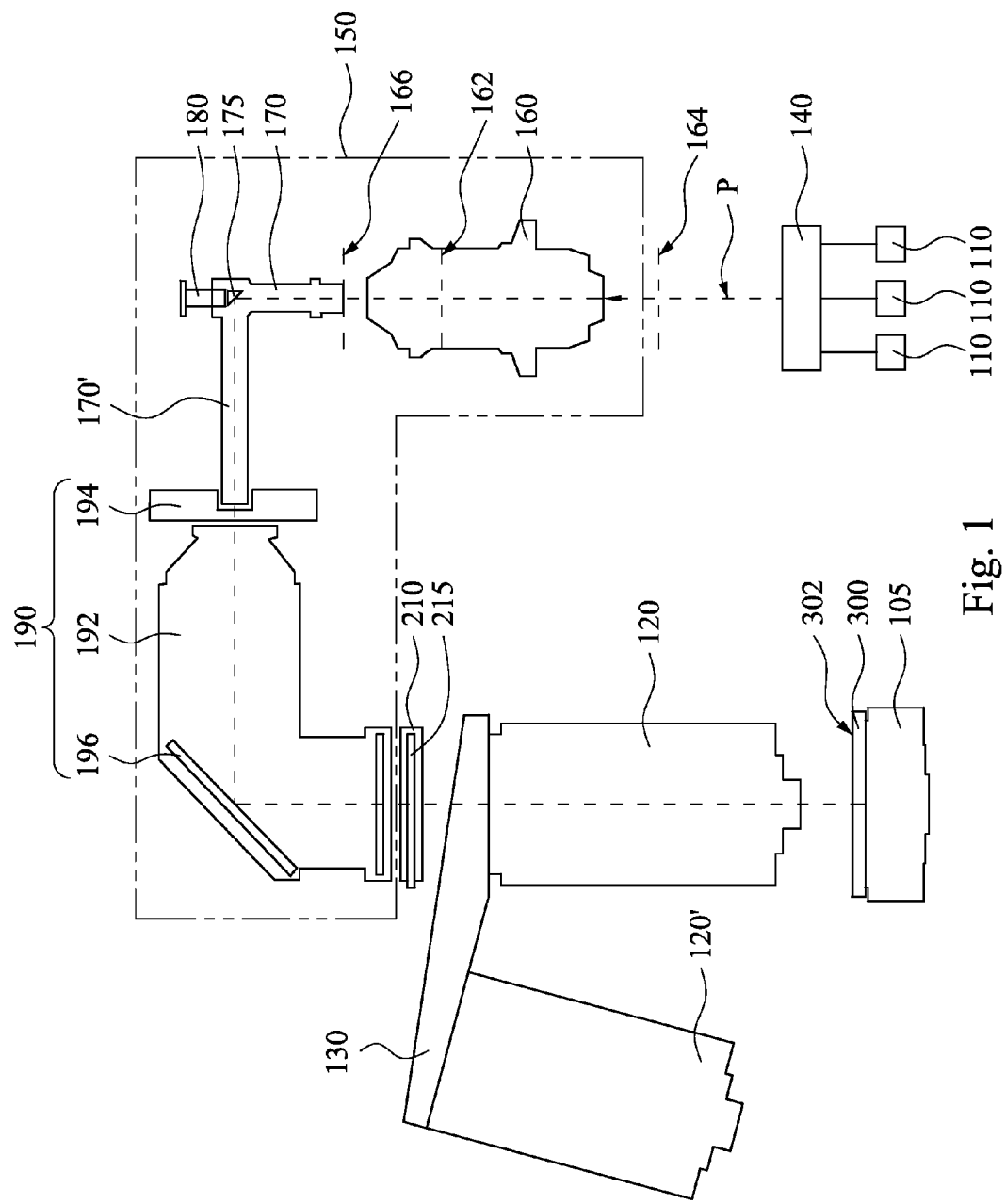
FIG. 1 is a schematic view of an exposure apparatus in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

As used herein, the terms "comprising," "including," "having," "containing," "involving," and the like are to be understood to be open-ended, i.e., to mean including but not limited to. As used herein, "around", "about", "substantially" or "approximately" shall generally mean within 20 percent, in some embodiments within 10 percent, and in another embodiments within 5 percent of a given value or range. Numerical quantities given herein are approximate, meaning that the term "around", "about", "substantially" or "approximately" can be inferred if not expressly stated. The singular forms "a", "an" and "the" used herein include plural referents unless the context clearly dictates otherwise.

The terms used in this specification generally have their ordinary meanings in the art and in the specific context where the terms are used. The use of examples in this specification, including examples of any terms discussed herein, is illustrative only, and in no way limits the scope and meaning of the disclosure or of any exemplified term. Likewise, the present disclosure is not limited to various embodiments given in this specification.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Reference throughout the specification to "some embodiments" means that a particular feature, structure, implementation, or characteristic described in connection with the embodiments is included in at least one embodiment of the present disclosure. Thus, uses of the phrases "in some embodiments" in various places throughout the specification are not necessarily all referring to the same embodiment. Furthermore, the particular features, structures, implementation, or characteristics may be combined in any suitable manner in one or more embodiments.

FIG. 1 is a schematic view of an exposure apparatus according to various embodiments of the present disclosure. The exposure apparatus is illustrated in a simplified form to describe components and systems that are well known, and more specifically describe components and systems that are unique to the present embodiments. In reality, the exposure apparatus may include more optical elements. The exposure apparatus includes at least one radiation source 110, a plurality of projection lenses 120 and 120', and a lens switch 130. The radiation source 110 is operable for providing a radiation beam. The lens switch 130 is operable for selecting one of the projection lenses 120 and 120' to focus the radiation beam to a target plane 302. In other words, the lens switch 130 is operable for moving one of the projection lenses 120 and 120' to a position in a path P along which the radiation beam travels from the radiation source 110 to the target plane 302. It is noted that the number of the projection lenses 120 and 120' in FIG. 1 is illustrative and should not limit the claimed scope of the disclosure. A person having ordinary skill in the art may select the number for the projection lenses according to actual requirements.

The projection lenses 120 and 120' may have the same focal length and/or exposure field size. As shown in FIG. 1, the projection lens 120 is disposed in the path P. In some embodiments, if the projection lens 120 is desired to be replaced, the lens switch 130 may move the projection lens 120' to the position in the path P to replace the projection lens 120. In this way, an operator can replace the projection lens 120 with the projection lens 120' without turning off the exposure apparatus.

In some embodiments, the lens switch 130 includes a lens turret, which is also called a revolving nosepiece, configured for holding the projection lenses 120 and 120'. For example, the lens turret may provide a plurality of holes in which the projection lenses 120 and 120' can be inserted. The projection lenses 120 and 120' may have the same or different focal length(s) and/or exposure field size(s). The lens turret can be rotated manually or electronically to move one of the projection lenses 120 and 120' to the position in the path P. For example, in a computerized exposure apparatus, an actuator, such as a motor, can actuate the rotation of the lens turret. However, the claimed scope of the disclosure should not be limited in this respect.

In some embodiments, a substrate 300, e.g., a wafer, can be disposed at the target plane 302, and the exposure apparatus may further include a stage 105 configured for supporting the substrate 300. The substrate 300 includes a layer of photosensitive material to be exposed using the exposure apparatus. In a lithography process for manufacturing semiconductor devices or the like, multilayer circuit patterns are overlaid and formed on the substrate 300. In other words, the semiconductor devices can be formed by exposing different mask patterns onto the substrate 300 in an overlapping way.

In some embodiments, the exposure apparatus further includes a radiation source switch 140 operable for selecting one of a plurality of the radiation sources 110 to provide the radiation beam, such that the radiation sources 110 can respectively expose the different mask patterns mentioned above during the exposure process. The radiation source switch 140 allows the wavelength of the radiation beam to be switched during the exposure process. For example, in some embodiments, the radiation source switch 140 selects different radiation sources 110 within the exposure process for a given substrate, such that the semiconductor device can be formed using the same exposure apparatus without the time consuming apparatus changing therebetween. Furthermore, since the semiconductor device can be formed using the same exposure apparatus, the overlay accuracy between the multilayer circuit patterns can be improved, and the aperture of the exposure apparatus can be adjusted conveniently.

In some embodiments, at least one of the radiation sources 100 is an ultraviolet light source, a deep ultraviolet (DUV) light source, an extreme ultraviolet (EUV) light source, or any combination thereof. The radiation source 100 may be a mercury lamp, a Krypton Fluoride (KrF) excimer laser for a working wavelength of substantially 248 nm, an Argon Fluoride (ArF) excimer laser for a working wavelength of substantially 193 nm, a Fluoride (F2) excimer laser for a working wavelength of substantially 157 nm, or the EUV light source for a working wavelength of substantially 13 nm. However, the claimed scope of the disclosure should not be limited in this respect.

As shown in FIG. 1, the radiation sources 110 can respectively provide the radiation beams with different wavelengths. The radiation source switch 140 selects the radiation sources 110 depending on the exposure mode to be operated. For example, when an ultraviolet mode is selected as the exposure mode, the radiation source switch 140 selects the ultraviolet light source, such as the mercury lamp, from the radiation sources 110 to provide an ultraviolet light beam. When a deep ultraviolet mode is selected as the exposure mode, the radiation source switch 140 selects the deep ultraviolet light source, such as the Krypton Fluoride (KrF) excimer laser, the Argon Fluoride (ArF) excimer laser, or the Fluoride (F2) excimer laser, from the radiation sources 110 to provide an ultraviolet light beam.

In some embodiments, the projection lenses 120 and 120' have different focal lengths and/or exposure field sizes. In greater detail, to get a possible exposure pattern from the projection lens 120 or 120', it is considered that the radiation source 110 is matched to the type of the projection lens 120 or 120'. That is, the projection lenses 120 and 120' can respectively focus the radiation beams with different wavelengths. For example, when the ultraviolet mode is selected as the exposure mode, one of the projection lenses 120 and 120' is moved to the position in the path P by the lens switch 130, and when the deep ultraviolet mode is selected as the exposure mode, another of the projection lenses 120 and 120' is moved to the position in the path P by the lens switch 130.

In some embodiments, the exposure apparatus further includes a reticle holder 210 configured for holding a reticle 215 (referred to herein as a photomask) in the path P along which the radiation beam travels from the radiation source 110 to the target plane 302, such that the reticle 215 is arranged in an object plane of the projection lens 120 or 120'. The reticle 215 is configured to provide the mask pattern to be exposed using the exposure apparatus. In FIG. 1, the reticle 215 is positioned in the exposure apparatus when performing the exposure process. The reticle 215 may include a transparent substrate and an absorption layer, wherein the absorption layer is a material providing for the absorption of radiation. The transparent substrate of the reticle 215 may be made of fused silica (SiO2), borosilicate glass, or soda-lime glass. The absorption layer may be made of chromium (Cr), iron oxide, molybdenum silicon (MoSi), zirconium silicon oxide (ZrSiO), silicon nitride (SiN), titanium nitride (TiN), or other radiation absorbing materials known in the art. The absorption layer forms one or more absorption regions where the radiation beam may be completely or partially absorbed and thereby blocked. Therefore, the radiation beam after traveling through the reticle 215 includes a pattern as provided by the mask pattern of the absorption/non-absorption regions.

In some embodiments, the exposure apparatus further includes an optical module 150 configured for guiding the radiation beam from the radiation source 100 to the selected projection lens 120 or 120'. The optical module 150 may include a plurality of optical elements such as lenses, mirrors, or filter elements.

For example, in some embodiments, the exposure apparatus further includes a zoom axicon (ZA) 160 disposed in the path P. By adjusting the zoom axicon 160, it is possible to set different annular intensity distributions in a pupil plane 162 of the zoom axicon 160 and, in some illumination settings, different degrees of coherence. The zoom axicon 160 ensures a radially symmetric or axisymmetric redistribution of light about an optical axis (e.g. the path P) of the pupil plane 162 as a symmetry axis. In some embodiments, the zoom axicon 160 includes a zoom objective and a pair of axicon elements that combine a zoom function for the continuously variable adjustment of the diameter of a light distribution and an axicon function for the radial redistribution of a light intensity. The axicon is a type of lens which has a conical surface on one side and a plane surface on the opposite side. The pair of axicon elements is composed by an axicon having a convex conical surface and the other a complementary concave conical surface. The zoom objective produces a parallel light of variable diameter. The radiation beam is shaped and controlled such that at the pupil plane 162 the radiation beam has a desired spatial intensity distribution. In FIG. 1, the pupil plane 162 of the zoom axicon 160 is within the zoom axicon 160, and an object plane 164 of the zoom axicon 160 is between the zoom axicon 160 and the radiation source 110.

In some embodiments, the exposure apparatus further includes two light pipes 170 and 170' configured for effecting transmission of the radiation beam. The light pipes 170 and 170' may be quartz rods (QRs). However, the claimed scope of the disclosure should not be limited in this respect. The exposure apparatus further includes a beam splitter 175. The two light pipes 170 and 170' are joined at the beam splitter 175. The beam splitter 175 may be a reflector or a right-angle prism configured to fold the radiation beam to a convenient orientation. In some embodiments, a focal plane 166 of the zoom axicon 160 can be located at the entrance of the light pipe 170.

In some embodiments, the exposure apparatus further includes an energy sensor (ES) 180 operable for measuring an intensity of the radiation beam. The energy sensor 180 may be a photodiode. However, the claimed scope of the disclosure should not be limited in this respect. A portion of the radiation beam is diverted to the energy sensor 180 by the beam splitter 175. The output of the energy sensor 180 is used in controlling the dose delivered in an exposure. In some embodiments, the beam splitter 175 is the right-angle prism, and the hypotenuse surface of which is partially silvered to allow a small, known proportion of the radiation beam energy through to the energy sensor 180. In various embodiments, the beam splitter 175 is the reflector, which may be formed by depositing aluminum on quartz. A pattern of small holes is etched into the aluminum layer so that only a known (relatively small) proportion of energy, e.g. 1%, is diverted to the energy sensor 180.

In some embodiments, the exposure apparatus further includes a filter 190 disposed in the path P for reducing the intensity of the radiation beam. The filter 190 may be a reticle edge masking assembly (REMA) system. The REMA system defines the area of the reticle 215 to be illuminated during the exposure process by blocking portions of the incident radiation beam. In some embodiments, the REMA system may be placed nearly adjacent to the reticle 215. A portion of the radiation beam is blocked (e.g., completely or partially absorbed) by the REMA system which blocks areas of the reticle 215 that are not intended to be exposed. Therefore, the radiation beam can be defined by at least the REMA system and the reticle 215 before being projected onto the substrate 300.

In FIG. 1, the REMA system includes a REMA lens 192, at least one blade 194, and a reflector 196. The REMA lens 192 is configured for imaging an intermediate field plane on the reticle 215. The REMA system may include a plurality of the blades 194 which are orthogonally positioned and movable in order to define an opening for the radiation beam to pass, in a similar way to the shutter of a camera aperture. In greater detail, the blades 194 can block radiation beam that may otherwise leak through pin holes in a border area, allow a selected portion of a full patterned area to be exposed, and selectively block reticle alignment targets so that they are not printed on the substrate 300. This gives rise to the term "border area" which represents the edge of the area of the reticle 215 to be exposed. The reflector 196, such as a mirror, is configured for directing the path P of the radiation beam originating from the light pipe 170' towards the projection lens 120.

During the operation of the exposure apparatus shown in FIG. 1, the radiation source switch 140 selects one of a plurality of the radiation sources 110 to provide the radiation beam, and the lens switch 130 moves one of the projection lenses 120 and 120' to the position in the path P. The radiation beam propagates to the optical module 150 which guides the radiation beam from the radiation source 100 to the projection lens 120. In greater detail, the radiation beam propagates to the zoom axicon 160 which sets different annular intensity distributions of the radiation beam in the pupil plane 162 and different degrees of coherence. The radiation beam then enters the light pipe 170, and a portion of the radiation beam is reflected by the beam splitter 175 to the filter 190. Another portion of the radiation beam is diverted to the energy sensor 180 by the beam splitter 175, such that the energy sensor 180 measures the intensity of the radiation beam. The filter 190 (e.g., the REMA system) defines the area of the reticle 215 to be illuminated during the exposure process by blocking portions of incident radiation beam. Subsequently, the radiation beam is defined by the REMA system and the reticle 215 and then is projected onto the substrate 300 by the projection lens 120.

It is understood that the embodiments of the exposure apparatus mentioned above is provided as examples and are not intended to be limiting. The exposure apparatus may have different configurations consistent with the spirit of the present disclosure in alternative embodiments depending on design requirements and manufacturing concerns.

Figure 2:
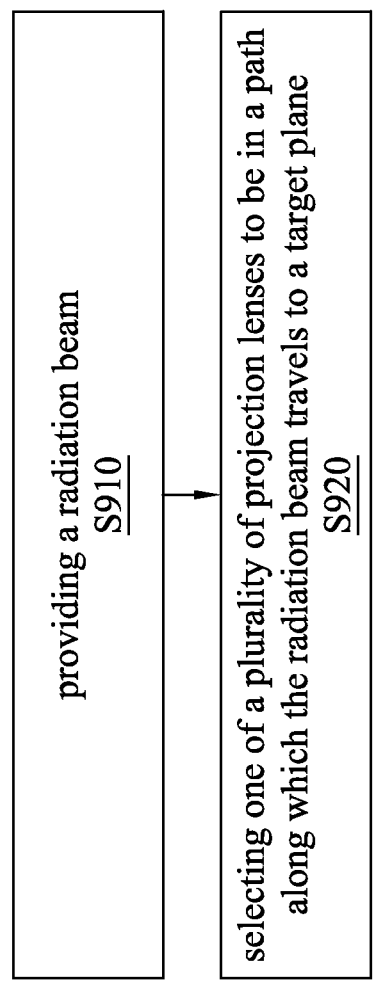
FIG. 2 is a flowchart of an exposure method in accordance with some embodiments.

Reference is made to FIG. 2 which is a flowchart of an exposure method according to various embodiments of the present disclosure. It is noted that the method may be applied to, but should be not limited to, the exposure apparatus of FIG. 1. As shown in the operation S910, a radiation beam is provided. In some embodiments, the radiation beam is provided by a radiation source which is substantially similar to the radiation source 110 of FIG. 1, and the radiation beam provided may be substantially similar to the radiation beam of FIG. 1. The radiation beam may be ultraviolet light, deep ultraviolet (DUV) light, extreme ultraviolet (EUV) light, or any combination thereof.

As shown in the operation S920, one of a plurality of projection lenses is selected to be in a path along which the radiation beam travels to a target plane. The projection lenses may be substantially similar to the projection lenses 120 and 120' of FIG. 1, the path may be substantially similar to the path P of FIG. 1, and the target plane may be substantially similar to the target plane 302 of FIG. 1. In some embodiments, the projection lenses are selected by a lens switch. If one of the projection lenses is desired to be replaced, another projection lens can be moved to the position in the path to replace the original projection lens. In this way, an operator can replace the projection lenses without turning off the exposure apparatus.

In some embodiments, the exposure method further includes the operation of:

selecting one of a plurality of radiation sources to provide the radiation beam.

The radiation sources may be substantially similar to the radiation sources 110 of FIG. 1. The radiation sources can respectively provide the radiation beams with different wavelengths, such that the radiation sources can respectively expose the different mask patterns during the exposure process. In some embodiments, the radiation sources can be selected by a radiation source switch which is substantially similar to the radiation source switch 140 of FIG. 1. The radiation source switch selects the radiation sources depending on the exposure mode to be operated. Furthermore, to get a possible exposure pattern from the projection lens, it is considered that the radiation source is matched to the type of the projection lens.

It should be noticed that the operations of FIG. 2 is exemplary, but they are not necessarily performed in the order shown. Operations may be added, replaced, changed order, and/or eliminated as appropriate, in accordance with the spirit and scope of disclosed embodiments.

According to the embodiments mentioned above, one form of the present disclosure provides an exposure apparatus including at least one radiation source, a plurality of projection lenses, and a lens switch. The radiation source is operable for providing a radiation beam. The lens switch is operable for selecting one of the projection lenses to focus the radiation beam to a target plane.

In some embodiments, the exposure apparatus further includes a radiation source switch operable for selecting one of a plurality of the radiation sources to provide the radiation beam.

In some embodiments, the lens switch includes a lens turret configured for holding the projection lenses.

In some embodiments, the exposure apparatus further includes an optical module configured for guiding the radiation beam from the radiation source to the selected projection lens.

In some embodiments, the exposure apparatus further includes a reticle holder configured for holding the reticle in a path along which the radiation beam travels from the radiation source to the target plane.

In some embodiments, the exposure apparatus further includes an energy sensor operable for measuring an intensity of the radiation beam.

In some embodiments, the exposure apparatus further includes a filter disposed in the path along which the radiation beam travels from the radiation source to the target plane for reducing the intensity of the radiation beam.

In some embodiments, the filter is a reticle edge masking assembly (REMA) system.

In some embodiments, the exposure apparatus further includes a zoom axicon disposed in the path along which the radiation beam travels from the radiation source to the target plane.

In some embodiments, at least two of the projection lenses have the same focal length.

In some embodiments, at least two of the projection lenses have the same exposure field size.

In some embodiments, at least two of the projection lenses have different focal lengths.

In some embodiments, at least two of the projection lenses have different exposure field sizes.

In some embodiments, the radiation source is the ultraviolet light source, the deep ultraviolet light source, the extreme ultraviolet light source, or any combination thereof.

Another form of the present disclosure provides the exposure apparatus including at least one radiation source, a plurality of the projection lenses, and a lens switch. The radiation source is operable for providing a radiation beam. The lens switch is operable for moving one of the projection lenses to a position in a path along which the radiation beam travels from the radiation source to a target plane.

In some embodiments, the exposure apparatus further includes a radiation source switch operable for selecting one of a plurality of the radiation sources to provide the radiation beam.

In some embodiments, the lens switch includes a lens turret configured for holding the projection lenses.

In some embodiments, the exposure apparatus further includes a reticle holder configured for holding the reticle in the path.

Yet another form of the present disclosure provides the exposure method including the operations of:

providing a radiation beam; and selecting one of a plurality of projection lenses to be in a path along which the radiation beam travels to a target plane.

In some embodiments, the method further includes the operation of:

selecting one of a plurality of radiation sources to provide the radiation beam.

In some embodiments, if the projection lens is desired to be replaced, the lens switch can move another projection lens to the position in the path to replace the original projection lens. In this way, an operator can replace the projection lens without turning off the exposure apparatus. In various embodiments, the radiation source switch allows the wavelength of the radiation beam to be adjusted during the exposure process. For example, the radiation source switch selects different radiation sources within an exposure process for a given substrate, such that a semiconductor device can be formed using the same exposure apparatus without the time consuming apparatus changing therebetween. Furthermore, since the semiconductor device can be formed using the same exposure apparatus, the overlay accuracy between the multilayer circuit patterns can be improved, and the aperture of the exposure apparatus can be adjusted conveniently.

Although the embodiments have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods, and steps described in the specification. A person having ordinary skill in the art can readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, at least one of the claims constitutes a separate embodiment, and the combination of various claims and embodiments are within the scope of the disclosure.

What is claimed is:

1. An exposure apparatus, comprising:
    a plurality of radiation sources;
    a radiation source switch operable for selecting one of the plurality of radiation sources to provide a radiation beam;
    a plurality of projection lenses with the same exposure field size;
    a lens switch operable for selecting one of the projection lenses to focus the radiation beam to a target plane; and
    a reticle holder configured for holding a reticle in a path along which the radiation beam travels from the selected one of the plurality of radiation sources to the target plane.

2. The exposure apparatus of claim 1, wherein the lens switch comprises:
    a lens turret configured for holding the projection lenses.

3. The exposure apparatus of claim 1, further comprising:
    an optical module configured for guiding the radiation beam from the selected one of the plurality of radiation sources to the selected one of the plurality of projection lenses.

4. The exposure apparatus of claim 1, further comprising:
    an energy sensor operable for measuring an intensity of the radiation beam.

5. The exposure apparatus of claim 1, further comprising:
    a filter disposed in the path for reducing an intensity of the radiation beam.

6. The exposure apparatus of claim 5, wherein the filter is a reticle edge masking assembly (REMA) system.

7. The exposure apparatus of claim 1, further comprising:
    a zoom axicon disposed in the path.

8. The exposure apparatus of claim 1, wherein the radiation sources comprise an ultraviolet light source, a deep ultraviolet light source, an extreme ultraviolet light source, or any combination thereof.

9. An exposure apparatus, comprising:
    at least one radiation source operable for providing a radiation beam;

a plurality of projection lenses with the same exposure field size;

a lens switch operable for moving one of the projection lenses to a position in a path along which the radiation beam travels from the radiation source to a target plane, wherein the lens switch comprises a lens turret holding the plurality of projection lenses; and a reticle holder configured for holding a reticle in the path.

10. The exposure apparatus of claim 9, further comprising:

a radiation source switch operable for selecting one of a plurality of the radiation sources to provide the radiation beam.

11. The exposure apparatus of claim 9, further comprising an optical module configured for guiding the radiation beam from the radiation source to the one of the projection lenses.

12. The exposure apparatus of claim 9, further comprising a filter disposed in the path.

13. The exposure apparatus of claim 9, wherein the radiation source is an ultraviolet light source, a deep ultraviolet light source, an extreme ultraviolet light source, or any combination thereof.

14. An exposure method, comprising:

selecting one of a plurality of radiation sources to provide a radiation beam;

selecting one of a plurality of projection lenses with the same exposure field size to be in a path along which the radiation beam travels to a target plane; and disposing a reticle in the path.

15. The exposure method of claim 14, further comprising:

guiding the radiation beam from the selected one of the plurality of radiation sources to the selected one of the plurality of projection lenses.

16. The exposure method of claim 14, further comprising: measuring an intensity of the radiation beam.

17. The exposure method of claim 14, further comprising reducing an intensity of the radiation beam.

18. The exposure method of claim 14, wherein the radiation beam is an ultraviolet light beam, a deep ultraviolet light beam, or an extreme ultraviolet light beam.

19. The exposure method of claim 14, wherein the selecting the one of the plurality of projection lenses comprising: moving the selected one of the plurality of projection lenses to be in the path.

20. The exposure method of claim 19, wherein the moving the selected one of the plurality of projection lenses comprises: rotating a lens turret holding the plurality of projection lenses.

* * * * *